(12) United States Patent
Kim et al.

(10) Patent No.: US 6,307,412 B1
(45) Date of Patent: Oct. 23, 2001

(54) CLOCK MONITOR CIRCUIT AND SYNCHRONOUS SEMICONDUCTOR MEMORY DEVICE UTILIZING THE CIRCUIT

(75) Inventors: Eun-Cheol Kim, Kwachon; Kook-Hwan Kwon, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/323,590

(22) Filed: Jun. 1, 1999

(30) Foreign Application Priority Data

May 29, 1998 (KR) .................................................. 98-19831

(51) Int. Cl.[7] ...................................................... H03K 5/01
(52) U.S. Cl. .......................... 327/165; 327/166; 327/176; 327/161
(58) Field of Search ................................ 326/93, 95, 98; 327/164, 165, 166, 172, 173, 174, 176, 224, 225, 34, 161

(56) References Cited

U.S. PATENT DOCUMENTS

| 4,717,835 | * | 1/1988 | Takeuchi | 327/176 |
| 4,988,901 | * | 1/1991 | Kamuro et al. | 327/18 |
| 5,146,110 | * | 9/1992 | Kim et al. | 326/95 |
| 5,184,032 | * | 2/1993 | Leach | 326/98 |
| 5,438,550 | * | 8/1995 | Kim | 365/93 |
| 6,078,193 | * | 6/2000 | Bazuin et al. | 326/93 |

* cited by examiner

Primary Examiner—Kenneth B. Wells
Assistant Examiner—Paul Dinh
(74) Attorney, Agent, or Firm—Marger Johnson & McCollom, P.C.

(57) ABSTRACT

A clock monitor circuit includes a first and second delay and clock signal generating unit for receiving a clock signal and an inverted clock signal, respectively. The first and second delay and clock signal generating units generate a first and second signals, respectively. A logic sum unit logically-sums the first and second signals to generate a stop clock signal. The clock monitor circuit according to the present invention can monitor the presence of a clock signal irrespective of an operation cycle of the clock signal. Further, the synchronous semiconductor memory device utilizing the clock monitor circuit according to the present invention is adapted to consume electric current only when a clock signal is present. That is, the device does not consume electric current when the clock signal is not present thereby reducing unnecessary waste of electric power in the stand-by mode.

22 Claims, 5 Drawing Sheets

CLOCK MONITOR CIRCUIT AND SYNCHRONOUS SEMICONDUCTOR MEMORY DEVICE UTILIZING THE CIRCUIT

BACKGROUND OF THE INVENTION

1. Field of the Invention

The present invention relates to a clock monitor circuit and, more particularly to a clock monitor circuit and synchronous semiconductor memory device utilizing the clock monitor circuit for monitoring the presence of a clock signal irrespective of its period.

2. Description of the Prior Art

Generally, a clock monitor circuit is adapted to monitor whether an input clock signal is present in a device that is synchronously operated by the input clock signal. If an input clock signal is not detected, the device stops operating, thereby preventing unnecessary waste of electric power.

In this regard, U.S. Pat. No. 4,633,097 describes a clock monitor circuit that changes two charge storage nodes and allows output to maintain a logic high level when an input clocking signal is present and a logic low level when the clocking signal is not present. The circuit therein described comprises a CMOS transistor that monitors the presence of the clocking signal by charging a node. For this reason, one disadvantage in this clock monitor circuit is that circuit's output signal is delayed by its RC time constant. Moreover, the clock monitor circuit cannot be used in a system where the period of the clock signal is longer than the circuit's RC time constant.

In addition, U.S. Pat. No. 5,619,643 describes a clock monitor circuit that detects an error state in a clocking signal used in a microprocessor system. The clock monitor circuit determines whether a clocking signal is present or not by charging and discharging a capacitance. Accordingly, like the circuit described in U.S. Pat. No. 4,633,097, the circuit disclosed in U.S. Pat. No. 5,619,643 monitors the clock signal by applying an electric charge. Therefore, just like the circuit described in the '097 patent, the clock monitor circuit of the '643 patent has the disadvantage of not being able to be used in a system where the period of the clock signal is longer than the RC time constant of the circuit.

A conventional synchronous semiconductor memory device generally has two modes of operation. In an operation mode, operations are synchronous with an externally input clock signal. In a standby mode, operations are stopped when the externally input clock signal is not present. However, because some circuits in the device operate irrespective of the clock signal, these circuits unnecessarily waste electric power during the standby mode.

To prevent this problem, conventional devices are provided with an additional power-down pin that stops all operations by applying a power-down signal when a user wants to utilize the standby mode in the device irrespective of the outside clock signal. However, providing an additional power down pin increases manufacturing costs.

Accordingly, a need remains for a clock monitor circuit that overcomes the problems associated with prior art clock monitor circuits.

SUMMARY OF THE INVENTION

It is an object of the present invention to overcome the problems of prior art clock monitor circuits.

It is another object of the present invention to provide a clock monitor circuit that monitors the presence of a clock signal irrespective of its period.

It is further an object of the present invention to provide a synchronous semiconductor memory device having a clock monitor circuit that prevents unnecessary waste of electric power during a standby mode. The clock monitor circuit of the present invention includes a first delay and clock signal generating circuit for receiving a clock signal and generating a first internal clock signal, the first internal clock signal making a first transition a first predetermined time after the clock signal makes a corresponding first transition. A second delay and clock signal generating circuit receives an inverted clock signal and generates a second internal clock signal, the second internal clock signal making a second transition a second predetermined time after the clock signal makes a corresponding second transition. A first logic gate generates a stop signal by logically manipulating the first and second internal clock signals.

The first delay and clock generating circuit comprises a first delay circuit for generating a first delay pulse. The first delay pulse makes a first change in logic states a first delay time after the clock signal makes a corresponding first change in logic states and makes a second change in logic states a second delay time after the clock signal makes a corresponding second change in logic states. A second logic gate generates the first internal clock signal by logically manipulating the first delay pulse and the clock signal.

The first delay circuit includes a first plurality of serially connected inverters. The first plurality of serially connected inverters comprises a first predetermined number of first inverters each having a first pull-up transistor and a first pull-down transistor, each first pull-up transistor having a small size and each first pull-down transistor having a large size. Also comprising the first delay circuit is a second predetermined number of second inverters each having a second pull-up transistor and a second pull-down transistor, the second pull-up transistor having a large size and the second pull-down transistor having a small size wherein the first and second inverters are alternately serially connected such that an output signal from a first inverter is an input signal to a second inverter and the first inverter in a first position is responsive to the clock signal.

Similarly, the second delay and clock generating circuit comprises a second delay circuit for generating a second delay pulse, the second delay pulse making the first change in logic states the first delay time after the inverted clock signal makes a corresponding first change in logic states and making the second change in logic states the second delay time after the inverted clock signal makes a corresponding second change in logic states and a third logic gate for generating the second internal clock signal by logically manipulating the second delay pulse and the inverted clock signal. The second delay circuit includes a second plurality of serially connected inverters. The second plurality of serially connected inverters comprises a third predetermined number of third inverters each having a third pull-up transistor and a third pull-down transistor, the third pull-up transistor having a small size and the third pull-down transistor having a large size. Also included in the second plurality of serially connected inverters is a fourth predetermined number of fourth inverters each having a fourth pull-up transistor and a fourth pull-down transistor, the fourth pull-up transistor having a large size and the fourth pull-down transistor having a small size wherein the third and fourth inverters are alternately serially connected such that an output signal from a third inverter is an input signal to a fourth inverter and the third inverter in a first position is responsive to the inverted clock signal.

The first logic gate may be an OR gate, the second logic gate may be NOR gate, and the third logic gate may be a NOR gate and wherein the stop signal is the logic-OR of the first and second internal clock signals. Alternatively, the first logic gate may be a NOR gate, the second logic gate may be a NOR gate, and the third logic gate may be a NOR gate and wherein the stop signal is the logic-NOR of the first and second internal clock signals.

BRIEF DESCRIPTION OF THE DRAWINGS

The foregoing objects, features, and advantages of the present invention will become more readily apparent from the detailed description of a preferred embodiment that proceeds with reference to the following drawings.

DETAILED DESCRIPTION OF THE PREFERRED EMBODIMENTS

Figure 1:
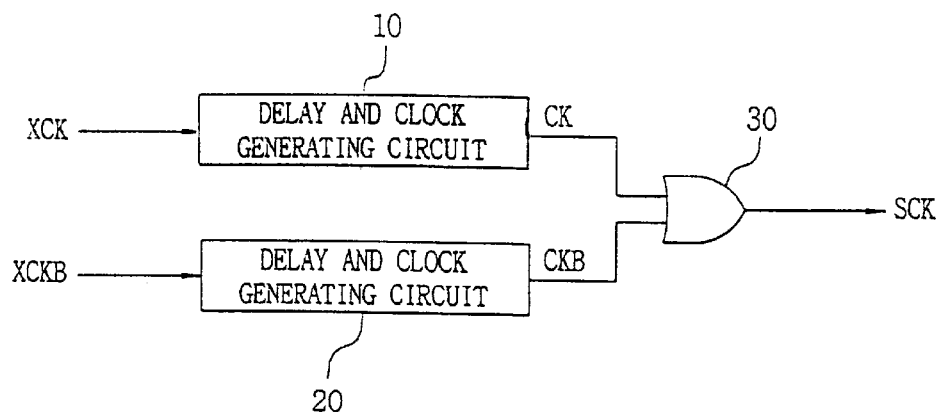
FIG. 1 is a circuit diagram of a clock monitor circuit according to a first embodiment of the present invention.

FIG. 1 is a circuit block diagram of a clock monitor circuit according to the first embodiment of the present invention. The monitor circuit includes delay and pulse generating circuits 10 and 20 and OR gate 30.

The delay and pulse generating circuits 10 and 20 receive a clock signal XCK and an inverted clock signal XCKB input from external circuitry. The delay and clock generating circuits 10 and 20 delay the signals XCK and XCKB, respectively, by a predetermined time and generate pulses CK and CKB, respectively. The OR gate 30 serves to logically sum output signals of the delay and pulse generating circuits 10 and 20 and generate a stop clock signal SCK.

Figure 2:
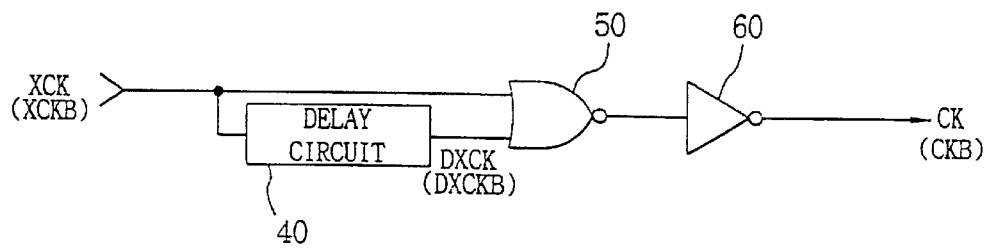
FIG. 2 is a circuit diagram of a delay and clock generating circuit according to the first embodiment of the present.

FIG. 2 is a circuit diagram of the delay and clock generating circuits 10 and 20 shown in FIG. 1. The delay and clock generating circuit includes a delay circuit 40, a NOR gate 50, and an inverter 60. The delay circuit 40 receives the external clock signal XCK and generates a pulse DXCK. The pulse signal DXCK changes from a logic low level to a logic high level by introducing a short delay when the clock signal XCK changes from a logic low level to a logic high level. The delay circuit 40 generates a pulse DXCK that changes from a logic high level to a logic low level by a long delay when the clock signal XCK changes from a logic high level to a logic low level. The NOR gate 50 and inverter 60 serve to logically sum the clock signal XCK and the output signal DXCK of the delay circuit 40 to generate a signal CK.

Figure 3:
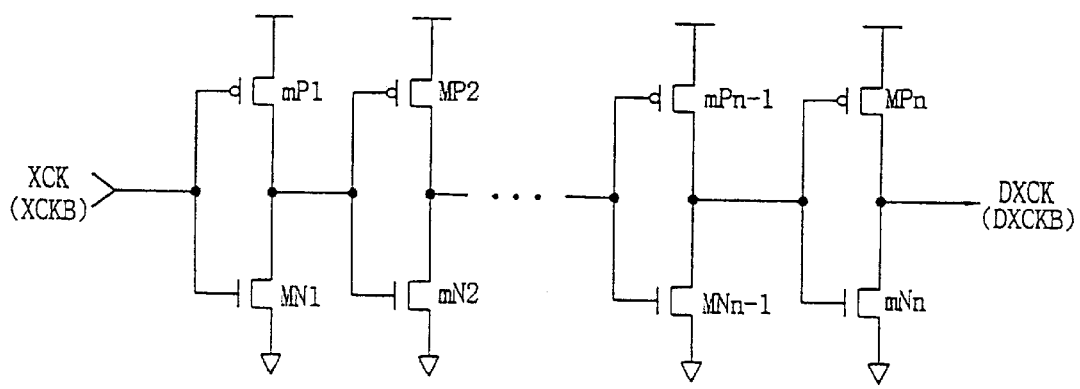
FIG. 3 is a circuit diagram of the delay circuit shown in FIG. 2.

FIG. 3 is a circuit diagram of an embodiment of the delay circuit 40 shown in FIG. 2. The circuit includes n serially-connected inverters, each inverter including 2n PMOS transistors mP1, MP2, . . . , mPn–1, MPn and 2n NMOS transistors MN1, mN2, . . . , MNn–1, mNn, where m indicates a small-sized transistor and M indicates a large-sized transistor.

The delay circuit 40 provides a path for the externally input clock signal XCK including the PMOS transistor mP1, the NMOS transistor mN2, and the NMOS transistor mNn of the last inverter such that a logic low level DXCK signal is generated when the clock signal XCK changes from a logic high to a logic low level. During this time, the delay time of the XCK and XCKB signals is longer because the signal path includes the small-sized transistors m.

The circuit of FIG. 3 provides a path for enabling the externally input clock signal XCK including the NMOS transistor MN1, the PMOS transistor MP2, and PMOS transistor MPn of the last inverter such that a logic high level DXCK signal is generated when the clock signal XCK changes from a logic low to a logic high level. During this time, the delay time of the DXCK signal is shorter because the signal path includes the large-sized transistors M.
The Relative Dimensions of the Small-sized Transistors m and the Large-sized Transistors M is, for Example, 2:5.

Accordingly, the clock monitor circuit as shown in FIG. 1 monitors the presence of a clock signal and generates a signal having a logic low level when the clock signal is not present and a signal having a logic high level when the clock signal is present.

Figure 4:
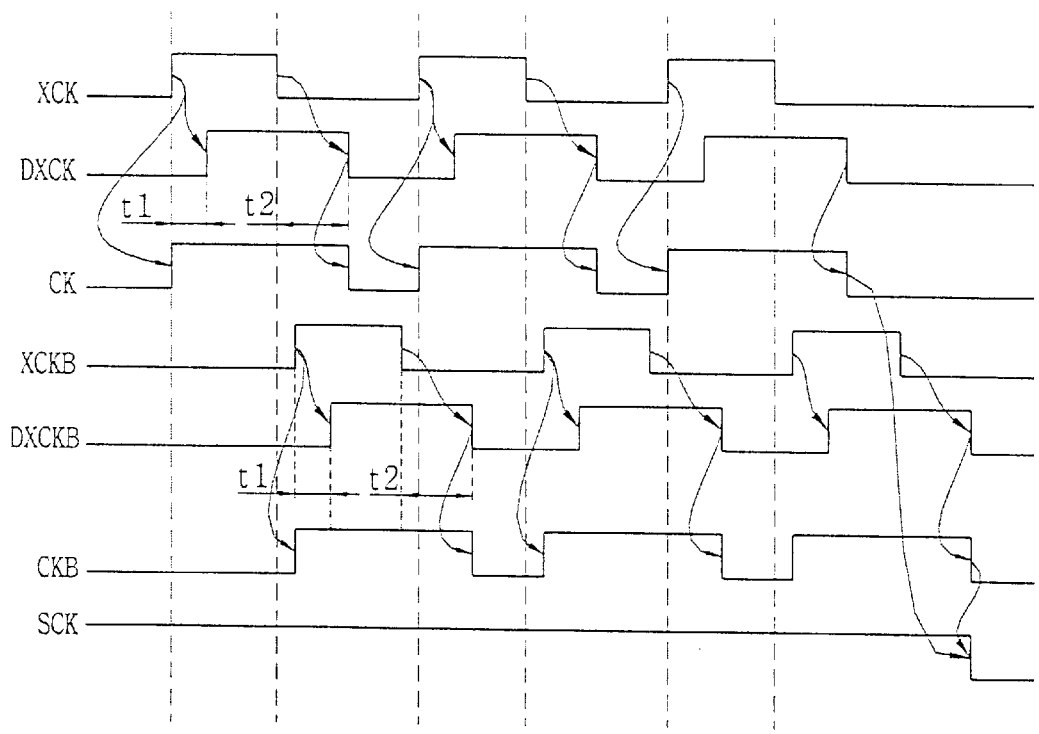
FIGS. 4 and 5 are timing diagrams of the circuits shown in FIGS. 1–3.

FIG. 4 is a timing diagram illustrating the operation of the clock monitor circuit shown in FIG. 1 when the skewed clock signal XCK and inverted clock signal XCKB are received. The clock monitor circuit provides a path for the clock signal XCK and inverted clock signal XCKB through the delay circuit shown in FIG. 3. The clock monitor circuit also generates pulses DXCK and DXCKB that change from a logic low to a logic high level after a delay time t1 and change from a logic high to a logic low level after a delay time t2. The pulses XCK and DXCK and XCKB and DXCKB pass through the NOR gate 50 and inverter 60 shown in FIG. 2 thereby generating the clock signals CK and CKB, respectively. The OR gate 30 shown in FIG. 1 serves to logically sum (ORing) the clock signals CK and CKB generating the stop clock signal SCK. FIG. 4 shows the operation of the first embodiment of the clock monitor circuit where the clock signal XCK is out of phase with the inverted clock signal XCKB.

Figure 5:
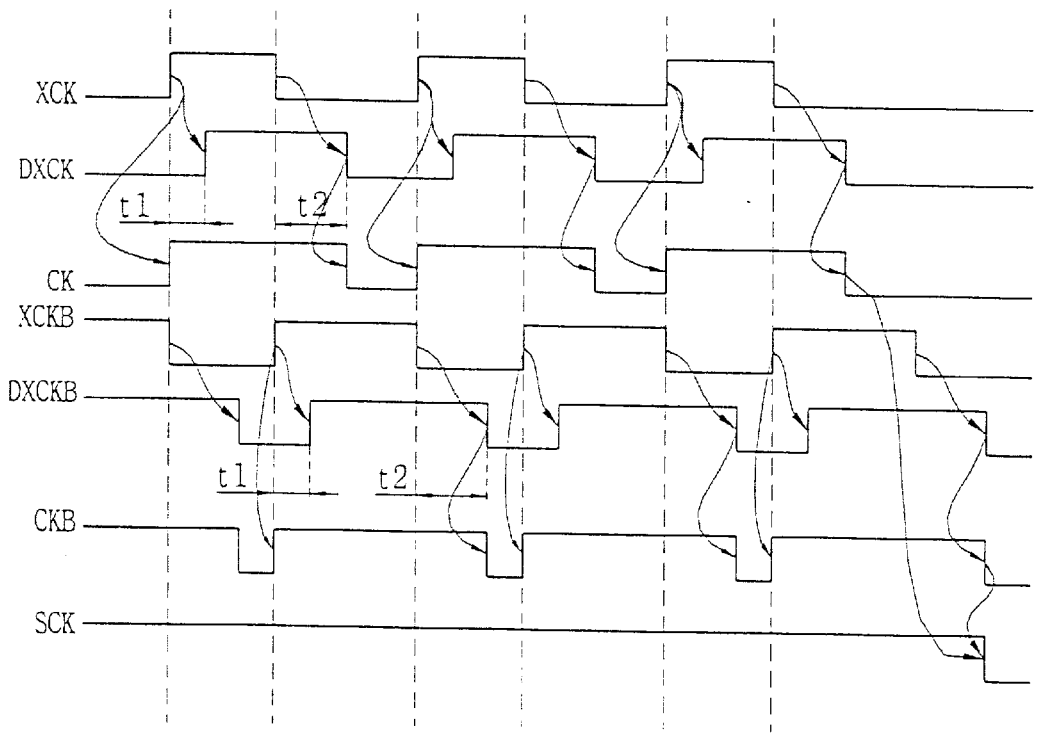

FIG. 5 shows the operation of the first embodiment of the clock monitor circuit where the clock signal XCK is 180° out of phase with the inverted clock signal XCKB. In FIG. 5, the clock signal XCK and the inverted clock signal XCKB are not skewed with respect to each other.

In case the phase of the clock signal XCK is identical with that of the inverted clock signal XCKB, the clock monitor circuit shown in FIG. 1 also generates the stop clock signal SCK therethrough. That is, the delay circuit generates pulses DXCK and DXCK(B) that are delayed by a delay time t1 when the clock signal XCK changes from a logic low to a logic high level and delayed by a delay time t2 when the inverted clock signal XCKB changes from a logic high to a logic low level. The clock monitor circuit logically-ORs the clock signal XCK and signal DXCK and the inverted clock signal XCKB and signal DXCKB, through NOR gate 50 thereby generating signals CK and CKB, respectively. The OR gate 30 logic-sums signals CK and CKB to generate the stop clock signal SCK. When the delay times t1 and t2 are incorrectly determined, the inner clock signal may be incorrectly generated. Thus the clock monitor circuit must be designed to generate the stop clock signal SCK after due consideration of the phase difference between the input clock signal XCK and inverted clock signal XCKB.

Figure 6:
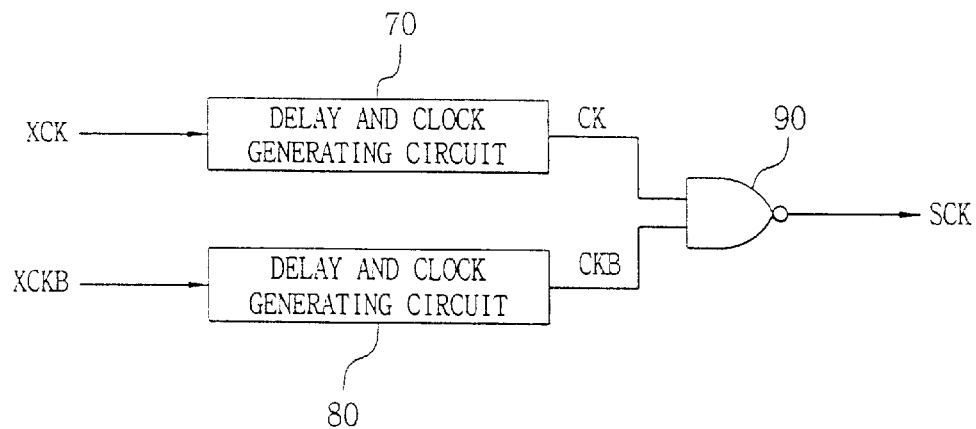
FIG. 6 is a circuit diagram of a clock monitor circuit according to a second embodiment of the present invention.

FIG. 6 shows a circuit diagram of the second embodiment of the inner clock generating circuit. The circuit includes clock generating circuits 70 and 80 and a NAND gate 90. That is, the NAND gate 90 in the circuit is utilized instead of the OR gate 30 shown in FIG. 1 to thereby generate the stop clock signal SCK. The circuit of FIG. 1 is designed to generate the stop clock signal SCK when the clock signal XCK and inverted clock signal XCKB are both at logic high levels.

The delay and clock generating circuits 70 and 80 respectively receive the clock signal XCK and inverted clock signal XCKB and respectively generate signals CK and CKB. The signals CK and CKB are not at a logic high level during the input of the clock signals.

The NAND gate 90 generates a stop clock signal SCK having a logic low level when the signals CK and CKB change to a logic high level.

Figure 7:
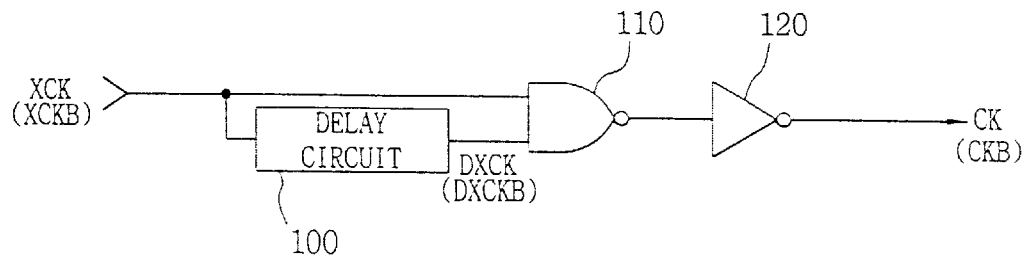
FIG. 7 is a circuit diagram of a delay and clock generating circuit according to the second embodiment of the present invention.

FIG. 7 shows the delay and clock generating circuits 70 and 80 shown in FIG. 6. The circuit includes a delay circuit 100, a NAND gate 110, and an inverter 120. The delay circuit 100 receives the externally input clock signal XCK and generates a pulse DXCK. The pulse DXCK includes a long delay and changes from a logic low to a logic high level when the clock signal XCK changes from a logic low to a logic high level. The delay circuit 100 generates a pulse DXCK that includes a short delay and changes from a logic high to a logic low level when the clock signal XCK changes from a logic high to a logic low level.

Figure 8:
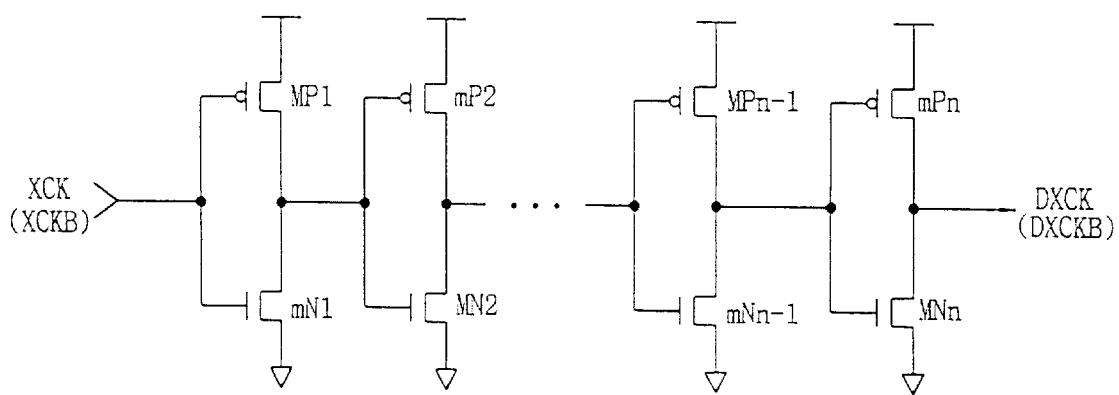
FIG. 8 is a circuit diagram of the delay circuit shown in FIG. 7.

FIG. 8 shows a circuit diagram of the delay circuit 100 shown in FIG. 6. The circuit includes n serially-connected inverters. The inverters include 2n PMOS transistors MP1, mP2, . . . , MPn−1, mPn and 2n NMOS transistors mN1, MN2, . . . , mNn−1, MNn. The reference literal m indicates a small-sized transistor and the reference literal M indicates a large-sized transistor.

The delay circuit 100 provides a path for the externally input clock signal XCK including the PMOS transistor MP1, NMOS transistor MN2, and NMOS transistor MNn of the last inverter such that a logic low level signal is generated when the clock signal XCK changes from a logic high to a logic low level. At that time, the delay time of the XCK and XCKB signals is shorter because the signal path includes the large-sized transistors.

The circuit allows the clock signal XCK to go through the NMOS transistor mN1, PMOS transistor mP2, and PMOS transistor mPn to generate a signal having a logic high while the clock signal XCK changes from a logic low to a logic high level. At this time, the delay time of the signals XCK and XCKB is longer because the signal path includes the small-sized transistors.

Accordingly, the clock monitor circuit shown in FIG. 6 detects the presence of the clock signal and generates a signal having a logic high level when the clock signal is present and a signal having a logic low level when the clock signal is not present.

Figure 9:
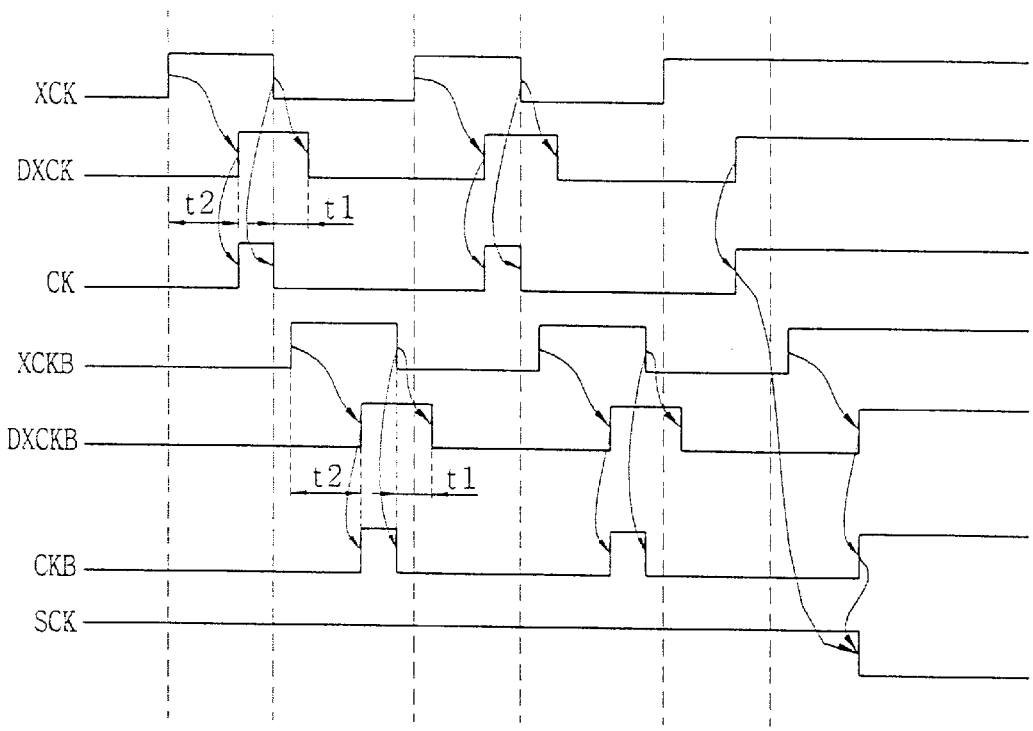
FIGS. 9 and 10 are timing diagrams of the circuits shown in FIGS. 6–8.

FIG. 9 is a timing diagram illustrating the operation of the clock monitor circuit shown in FIG. 6 when the skewed clock signal XCK and inverted clock signal XCKB are received. The clock monitor circuit provides a path for the clock signal XCK and inverted clock signal XCKB through the delay circuit shown in FIG. 6. The clock monitor circuit generates pulse DXCK and DXCKB that change from a logic high to a logic low level after a delay time t1. The pulses DXCK and DXCKB go through the NAND gate 110 and inverter 120, as shown in FIG. 7, causing the clock signals CK and CKB to be generated, respectively. The NAND gate 90 generates the stop clock signal SCK by logically-NANDing the clock signals CK and CKB.

The second embodiment of the clock monitor circuit described above with reference to timing diagram FIG. 9 illustrates the operation of the circuit when the clock signal XCK is out of phase with the clock signal XCKB.

Figure 10:
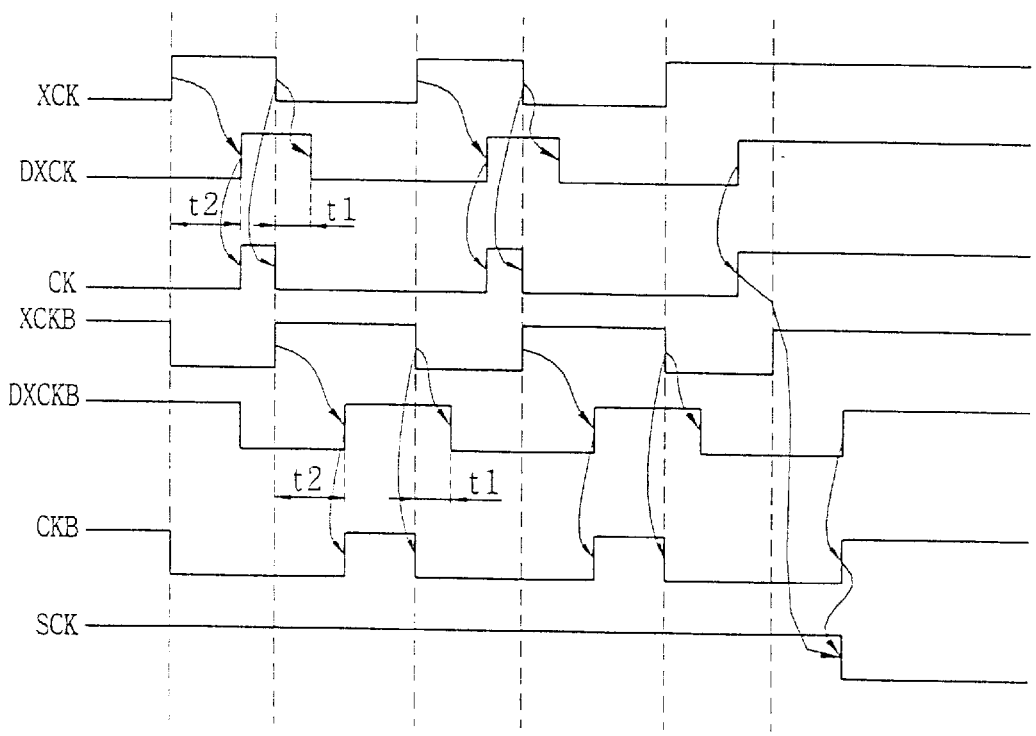

FIG. 10 is a timing diagram illustrating the operation of the clock monitor circuit shown in FIG. 6. More particularly, the timing diagram illustrates the operation of the clock monitor circuit when the inverted clock signal XCKB and clock signal XCK are 180° out of and are not skewed relative to one another.

Even if the clock signal XCK and inverted clock signal XCKB correspond in its phase, a stop clock signal SCK is generated through the clock monitor circuit shown in FIG. 6. That is, the delay circuit generates a pulse that is delayed by a delay time t2 when the clock signal XCK changes from a logic low to high level and a pulse that is delayed by a delay time t1 when the inverted clock signal XCKB is shifted from a logic high to a logic low level. The delay circuit 100 includes logic that produces the clock signal DXCK and the inverted clock signal DXCKB to thereafter generate the signals CK and CKB. Finally, the NAND gate 90 shown in FIG. 6 generates signals CK and CKB logically NANDing to generate the exact stop clock signal SCK. The clock monitor circuit must be designed to generate a stop clock signal SCK after consideration of phase differences between the inverted clock signal XCKB and the inputted clock signal XCK. Failure to do so might lead to system failures.

The clock monitor circuit according to the present invention allows the clock signal XCK and inverted clock signal XCKB to be inputted through the delay and clock generating circuits 70 and 80 to generate output signals CK and CKB that do not change to a logic low level when a clock signal is generated. The clock monitor circuit logic-sums the output signals to generate the stop clock signal SCK. Alternatively, the clock monitor circuit generates output signals CK and CKB that do not change to a logic high level when a clock signal is generated.

Figure 11:
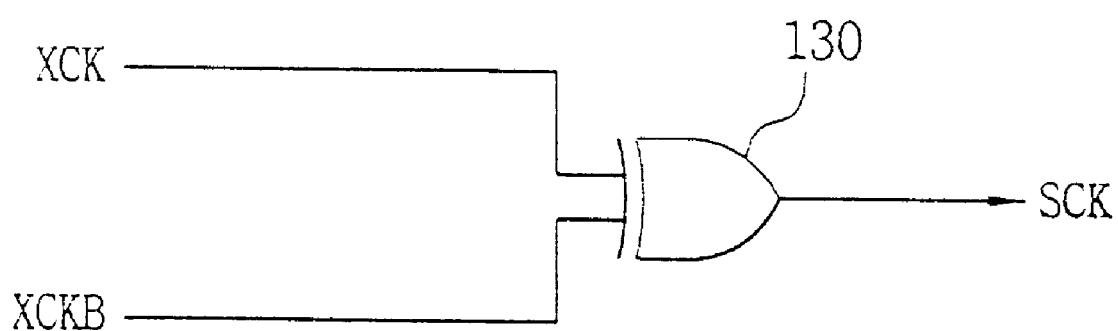
FIG. 11 is a circuit diagram of a clock monitor circuit according to the third embodiment of the present invention.

FIG. 11 shows a circuit diagram of the third embodiment of the clock monitor circuit including a XOR gate 130. The XOR gate 130 shown in FIG. 11 allows the inverted signal XCKB and the non-skewed clock signal XCK to generate a stop clock signal SCK. The gate can be applied to both cases where the clock signal and inverted clock signal are at logic high or logic low levels.

The stop clock signal SCK maintains a high level when the semiconductor device is being operated in response to the externally input clock signal XCK. In contrast, the stop signal SCK allows a signal having a low level to be generated when the semiconductor device is in a stand-by mode as the clock signal XCK is not generated.

The clock monitor circuit according to the present invention is provided to a clock signal input terminal of the synchronous semiconductor memory device to thereby generate an internal clock signal. The internal clock signal is applied to internal blocks of the semiconductor memory device (for example, sense amplifier, electric power generating circuit and so forth), so that the internal blocks consume electric power in an operation mode, but not in a stand-by mode. Doing so, prevents unnecessary waste of electric power in the stand-by mode. Accordingly, the clock monitor circuit of the present invention can monitor the presence of a clock signal irrespective of the operation cycle of the clock signal.

Further, the synchronous semiconductor memory device utilizing the clock monitor circuit according to the present invention is adapted to consume electric current only when a clock signal is present. That is, the device does not consume electric current when the clock signal is not present thereby reducing unnecessary waste of electric power in the stand-by mode.

What is claimed is:

1. A clock monitor circuit, comprising:
   a first delay and clock signal generating circuit for receiving a clock signal, the first delay and clock signal generating circuit generating a first internal clock signal, the first internal clock signal making a first transition a first predetermined time after the clock signal makes a corresponding first transition;
   a second delay and clock signal generating circuit for receiving an inverted clock signal, the inverted clock signal being a substantial inverse of the clock signal and having a skew relative to the clock signal, the second delay and clock signal generating circuit generating a second internal clock signal, the second internal clock signal making a second transition a second predetermined time after the inverted clock signal makes a corresponding second transition; and
   a stop signal generating circuit adapted to generate a stop signal by logically manipulating the first and second internal clock signals, the stop signal having a first and a second state responsive to the logical manipulation of the first and second internal clock signals, the stop signal being in the first state when the clock and inverted clock signals are in the first state
   wherein the first delay and clock signal generating circuit comprises:
      a first predetermined number of first inverters each having a first pull-up transistor and a first pull-down transistor, each first pull-up transistor having a small size and each first pull-down transistor having a large size; and
      a second predetermined number of second inverters each having a second pull-up transistor and a second pull-down transistor, the second pull-up transistor having a large size and the second pull-down transistor having a small size.

2. The clock monitor circuit according to claim 1 wherein the first delay and clock generating circuit comprises:
   a first delay circuit for generating a first delay pulse, the first delay pulse making a first change in logic states a first delay time after the clock signal makes a corresponding first change in logic states and making a second change in logic states a second delay time after the clock signal makes a corresponding second change in logic states; and
   a second logic gate for generating the first internal clock signal by logically manipulating the first delay pulse and the clock signal.

3. The clock monitor circuit according to claim 2 wherein the second delay and clock generating circuit comprises:
   a second delay circuit for generating a second delay pulse, the second delay pulse making the first change in logic states the first delay time after the inverted clock signal makes a corresponding first change in logic states and making the second change in logic states the second delay time after the inverted clock signal makes a corresponding second change in logic states; and
   a third logic gate for generating the second internal clock signal by logically manipulating the second delay pulse and the inverted clock signal.

4. The clock monitor circuit according to claim 3 wherein the first logic gate is an OR gate, the second logic gate is a NOR gate, and the third logic gate is an NOR gate and wherein the stop signal is the logic-OR of the first and second internal clock signals.

5. The clock monitor circuit according to claim 3 wherein the first logic gate is a NOR gate, the second logic gate is a NOR gate, and the third logic gate is a NOR gate and wherein the stop signal is the logic-NOR of the first and second internal clock signals.

6. The clock monitor circuit according to claim 1 wherein the second delay and clock signal generating circuit comprises:
   a third predetermined number of third inverters each having a third pull-up transistor and a third pull-down transistor, the third pull-up transistor having a small size and the third pull-down transistor having a large size; and
   a fourth predetermined number of fourth inverters each having a fourth pull-up transistor and a fourth pull-down transistor, the fourth pull-up transistor having a large size and the fourth pull-down transistor having a small size.

7. A clock monitor circuit, comprising:
   a first delay and clock signal generating circuit for receiving a clock signal, the first delay and clock signal generating circuit generating a first internal clock signal, the first internal clock signal making a first transition a first predetermined time after the clock signal makes a corresponding first transition;
   a second delay and clock signal generating circuit for receiving an inverted clock signal, the inverted clock signal being a substantial inverse of the clock signal and having a skew relative to the clock signal, the second delay and clock signal generating circuit generating a second internal clock signal, the second internal clock signal making a second transition a second predetermined time after the inverted clock signal makes a corresponding second transition; and
   a stop signal generating circuit adapted to generate a stop signal by logically manipulating the first and second internal clock signals, the stop signal having a first and a second state responsive to the logical manipulation of the first and second internal clock signals, the stop signal being in the first state in a standby mode;
   wherein the first delay and clock generating circuit comprises:
      a first delay circuit for generating a first delay pulse, the first delay pulse making a first change in logic states a first delay time after the clock signal makes a corresponding first change in logic states and making a second change in logic states a second delay time after the clock signal makes a corresponding second change in logic states; and
      a second logic gate for generating the first internal clock signal by logically manipulating the first delay pulse and the clock signal;
   wherein the first delay circuit includes a first plurality of serially connected inverters comprising:
      a first predetermined number of first inverters each having a first pull-up transistor and a first pull-down transistor, each first pull-up transistor having a small size and each first pull-down transistor having a large size; and
      a second predetermined number of second inverters each having a second pull-up transistor and a second pull-down transistor, the second pull-up transistor having a large size and the second pull-down transistor having a small size; and wherein the first and second inverters are alternately serially connected such that an output signal from a first inverter is an input signal to a second inverter and the first inverter in a first position is responsive to the clock signal.

8. A clock monitor circuit, comprising:

a first delay and clock signal generating circuit for receiving a clock signal, the first delay and clock signal generating circuit generating a first internal clock signal, the first internal clock signal making a first transition a first predetermined time after the clock signal makes a corresponding first transition;

a second delay and clock signal generating circuit for receiving an inverted clock signal, the inverted clock signal being a substantial inverse of the clock signal and having a skew relative to the clock signal, the second delay and clock signal generating circuit generating a second internal clock signal, the second internal clock signal making a second transition a second predetermined time after the inverted clock signal makes a corresponding second transition;

a stop signal generating circuit adapted to generate a stop signal by logically manipulating the first and second internal clock signals, the stop signal having a first and a second state responsive to the logical manipulation of the first and second internal clock signals, the stop signal being in the first state in a standby mode;

wherein the first delay and clock generating circuit comprises:
 a first delay circuit for generating a first delay pulse, the first delay pulse making a first change in logic states a first delay time after the clock signal makes a corresponding first change in logic states and making a second change in logic states a second delay time after the clock signal makes a corresponding second change in logic states; and
 a second logic gate for generating the first internal clock signal by logically manipulating the first delay pulse and the clock signal;

wherein the second delay and clock generating circuit comprises:
 a second delay circuit for generating a second delay pulse, the second delay pulse making the first change in logic states the first delay time after the inverted clock signal makes a corresponding first change in logic states and making the second change in logic states the second delay time after the inverted clock signal makes a corresponding second change in logic states;
 a third logic gate for generating the second internal clock signal by logically manipulating the second delay pulse and the inverted clock signal;

wherein the second delay circuit includes a second plurality of serially connected inverters comprising:
 a third predetermined number of third inverters each having a third pull-up transistor and a third pull-down transistor, the third pull-up transistor having a small size and the third pull-down transistor having a large size; and
 a fourth predetermined number of fourth inverters each having a fourth pull-up transistor and a fourth pull-down transistor, the fourth pull-up transistor having a large size and the fourth pull-down transistor having a small size; and wherein the third and fourth inverters are alternately serially connected such that an output signal from a third inverter is an input signal to a fourth inverter and the third inverter in a first position is responsive to the inverted clock signal.

9. A semiconductor memory device operating synchronous with a clock signal, comprising:

first delay and clock signal generating means for receiving a clock signal and generating a first internal clock signal, the first internal clock signal making a first transition a first predetermined time after the clock signal makes a corresponding first transition;

second delay and clock signal generating means for receiving an inverted clock signal and generating a second internal clock signal, the second internal clock signal making a second transition a second predetermined time after the inverted clock signal makes a corresponding second transition; and first logic means for generating a stop signal by logically manipulating the first and second internal clock signals, the stop signal having a first logic state when the clock and inverted clock signals are in a first state wherein the first delay and clock signal generating means includes a first plurality of serially connected inverters comprising:
 a first predetermined number of first inverters each having a first pull-up transistor and a first pull-down transistor, each first pull-up transistor having a small size and each first pull-down transistor having a large size; and
 a second predetermined number of second inverters each having a second pull-up transistor and a second pull-down transistor, the second pull-up transistor having a large size and the second pull-down transistor having a small size; and wherein the first and second inverters are alternately serially connected such that an output signal from a first inverter is an input signal to a second inverter and the first inverter in a first position is responsive to the clock signal.

10. The clock monitor circuit according to claim 9 wherein the first delay and clock generating means comprises:

first delay means for generating a first delay pulse, the first delay pulse making a first change in logic states a first delay time after the clock signal makes a corresponding first change in logic states and making a second change in logic states a second delay time after the clock signal makes a corresponding second change in logic states; and second logic means for generating the first internal clock signal by logically manipulating the first delay pulse and the clock signal.

11. The device according to claim 10 wherein the second delay and clock generating means comprises:

second delay means for generating a second delay pulse, the second delay pulse making the first change in logic states the first delay time after the inverted clock signal makes a corresponding first change in logic states and making the second change in logic states the second delay time after the inverted clock signal makes a corresponding second change in logic states;

third logic means for generating the second internal clock signal by logically manipulating the second delay pulse and the inverted clock signal.

12. The device according to claim 11 wherein the first logic means is an OR gate, the second logic means is a NOR gate, and the third logic means is an NOR gate and wherein the stop signal is the logic-OR of the first and second internal clock signals.

13. The device according to claim 11 wherein the first logic means is a NOR gate, the second logic means is a NOR gate, and the third logic means is a NOR gate and wherein the stop signal is the logic-NOR of the first and second internal clock signals.

14. The semiconductor memory device of claim 9 wherein the second delay means includes a second plurality of serially connected inverters comprising:
   a third predetermined number of third inverters each having a third pull-up transistor and a third pull-down transistor, the third pull-up transistor having a small size and the third pull-down transistor having a large size; and
   a fourth predetermined number of fourth inverters each having a fourth pull-up transistor and a fourth pull-down transistor, the fourth pull-up transistor having a large size and the fourth pull-down transistor having a small size; and
   wherein the third and fourth inverters are alternately serially connected such that an output signal from a third inverter is an input signal to a fourth inverter and the third inverter in a first position is responsive to the inverted clock signal.

15. A clock monitor circuit, comprising:
   first delay and clock signal generating means for receiving a clock signal and generating a first internal clock signal, the first internal clock signal making a first transition a first predetermined time after the clock signal makes a corresponding first transition;
   second delay and clock signal generating means for receiving an inverted clock signal and generating a second internal clock signal, the second internal clock signal making a second transition a second predetermined time after the inverted clock signal makes a corresponding second transition; and
   first logic means for generating a stop signal by logically manipulating the first and second internal clock signals, the stop signal having a first logic state when the clock and inverted clock signals are in a first state and the device is in a standby mode;
   wherein the first delay and clock generating means comprises:
      first delay means for generating a first delay pulse, the first delay pulse making a first change in logic states a first delay time after the clock signal makes a corresponding first change in logic states and making a second change in logic states a second delay time after the clock signal makes a corresponding second change in logic states; and
      second logic means for generating the first internal clock signal by logically manipulating the first delay pulse and the clock signal;
   wherein the first delay means includes a first plurality of serially connected inverters comprising:
      a first predetermined number of first inverters each having a first pull-up transistor and a first pull-down transistor, each first pull-up transistor having a small size and each first pull-down transistor having a large size; and
      a second predetermined number of second inverters each having a second pull-up transistor and a second pull-down transistor, the second pull-up transistor having a large size and the second pull-down transistor having a small size; and
      wherein the first and second inverters are alternately serially connected such that an output signal from a first inverter is an input signal to a second inverter and the first inverter in a first position is responsive to the clock signal.

16. A clock monitor circuit, comprising:
   first delay and clock signal generating means for receiving a clock signal and generating a first internal clock signal, the first internal clock signal making a first transition a first predetermined time after the clock signal makes a corresponding first transition;
   second delay and clock signal generating means for receiving an inverted clock signal and generating a second internal clock signal, the second internal clock signal making a second transition a second predetermined time after the inverted clock signal makes a corresponding second transition; and
   first logic means for generating a stop signal by logically manipulating the first and second internal clock signals, the stop signal having a first logic state when the clock and inverted clock signals are in a first state and the device is in a standby mode;
   wherein the first delay and clock generating means comprises:
      first delay means for generating a first delay pulse, the first delay pulse making a first change in logic states a first delay time after the clock signal makes a corresponding first change in logic states and making a second change in logic states a second delay time after the clock signal makes a corresponding second change in logic states; and
      second logic means for generating the first internal clock signal by logically manipulating the first delay pulse and the clock signal;
   wherein the second delay and clock generating means comprises:
      second delay means for generating a second delay pulse, the second delay pulse making the first change in logic states the first delay time after the inverted clock signal makes a corresponding first change in logic states and making the second change in logic states the second delay time after the inverted clock signal makes a corresponding second change in logic states; and
      third logic means for generating the second internal clock signal by logically manipulating the second delay pulse and the inverted clock signal;
   wherein the second delay means includes a second plurality of serially connected inverters comprising:
      a third predetermined number of third inverters each having a third pull-up transistor and a third pull-down transistor, the third pull-up transistor having a small size and the third pull-down transistor having a large size; and
      a fourth predetermined number of fourth inverters each having a fourth pull-up transistor and a fourth pull-down transistor, the fourth pull-up transistor having a large size and the fourth pull-down transistor having a small size; and
   wherein the third and fourth inverters are alternately serially connected such that an output signal from a third inverter is an input signal to a fourth inverter and the third inverter in a first position is responsive to the inverted clock signal.

17. A method for detecting a clock signal in a synchronous semiconductor memory device to thereby reduce power consumption, comprising:

receiving the clock signal and an inverted clock signal, the inverted clock signal having a skew relative to the clock signal;

generating a first internal clock signal, the first internal clock signal making a first transition a first predetermined time after the clock signal makes a corresponding first transition;

generating a second internal clock signal, the second internal clock signal making a second transition a second predetermined time after the inverted clock signal makes a corresponding second transition; and generating a stop signal by logically manipulating the first and second internal clock signals, the stop signal having a first logic state when the clock and inverted clock signal are in the first logic state wherein generating the first internal clock signal comprises:
serially connecting a first plurality of inverters comprising:
a first predetermined number of first inverters each having a first pull-up transistor and a first pull-down transistor, each first pull-up transistor having a small size and each first pull-down transistor having a large size; and
a second predetermined number of second inverters each having a second pull-up transistor and a second pull-down transistor, the second pull-up transistor having a large size and the second pull-down transistor having a small size; and
wherein the first and second inverters are alternately serially connected such that an output signal from a first inverter is an input signal to a second inverter and the first inverter in a first position is responsive to the clock signal wherein generating the second internal clock signal comprises:
serially connecting a second plurality of inverters comprising:
a third predetermined number of third inverters each having a third pull-up transistor and a third pull-down transistor, the third pull-up transistor having a small size and the third pull-down transistor having a large size; and
a fourth predetermined number of fourth inverters each having a fourth pull-up transistor and a fourth pull-down transistor, the fourth pull-up transistor having a large size and the fourth pull-down transistor having a small size; and
wherein the third and fourth inverters are alternately serially connected such that an output signal from a third inverter is an input signal to a fourth inverter and the third inverter in a first position is responsive to the inverted clock signal.

18. The method of detecting a clock signal according to claim 17 wherein generating the first internal clock signal comprises:

generating a first delay pulse, the first delay pulse making a first change in logic states a first delay time after the clock signal makes a corresponding first change in logic states and making a second change in logic states a second delay time after the clock signal makes a corresponding second change in logic states; and generating the first internal clock signal by logically manipulating the first delay pulse and the clock signal.

19. The method for detecting a clock signal according to claim 18 wherein generating the second internal clock signal comprises:

generating a second delay pulse, the second delay pulse making the first change in logic states the first delay time after the inverted clock signal makes a corresponding first change in logic states and making the second change in logic states the second delay time after the inverted clock signal makes a corresponding second change in logic states;

generating the second internal clock signal by logically manipulating the second delay pulse and the inverted clock signal.

20. The method for detecting a clock signal according to claim 19 wherein:

generating a stop signal by logically manipulating the first and second internal clock signal includes logically ORing the first and second internal clock signals;

generating the first internal clock signal by logically manipulating the first delay pulse and the clock signal includes logically NORing the first delay pulse and the clock signal; and generating the second internal clock signal by logically manipulating the second delay pulse and the inverted clock signal includes logically NORing the second delay pulse and the inverted clock signal.

21. The method for detecting a clock signal according to claim 19 wherein:

generating a stop signal by logically manipulating the first and second internal clock signal includes logically NORing the first and second internal clock signals;

generating the first internal clock signal by logically manipulating the first delay pulse and the clock signal includes logically NORing the first delay pulse and the clock signal; and generating the second internal clock signal by logically manipulating the second delay pulse and the inverted clock signal includes logically NORing the second delay pulse and the inverted clock signal.

22. The method for detecting a clock signal in a synchronous semiconductor device of claim 17 wherein the clock signal and the inverted clock signal are 180 degrees out of phase.

* * * * *

UNITED STATES PATENT AND TRADEMARK OFFICE
CERTIFICATE OF CORRECTION

PATENT NO.    : 6,307,412 B1
DATED         : October 23, 2001
INVENTOR(S)   : Kim et al.

It is certified that error appears in the above-identified patent and that said Letters Patent is hereby corrected as shown below:

Column 1,
Line 46, "arc" should read -- are --.

Column 10,
Line 41, "The clock monitor circuit according" should read -- The device according --.

Column 12,
Line 1, "arc" should read -- are --.

Signed and Sealed this

Twenty-ninth Day of October, 2002

Attest:

Attesting Officer

JAMES E. ROGAN
*Director of the United States Patent and Trademark Office*